United States Patent
Takahashi

(10) Patent No.: US 6,228,174 B1
(45) Date of Patent: *May 8, 2001

(54) HEAT TREATMENT SYSTEM USING RING-SHAPED RADIATION HEATER ELEMENTS

(76) Inventor: Ichiro Takahashi, 16-12 Zaimokuza 2-chome, Kamakura-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/481,028

(22) Filed: Jan. 11, 2000

Related U.S. Application Data

(63) Continuation-in-part of application No. 09/280,891, filed on Mar. 29, 1999, now Pat. No. 6,106,628, and a continuation-in-part of application No. 09/280,024, filed on Mar. 26, 1999.

(30) Foreign Application Priority Data

Nov. 24, 1999 (JP) .................................... 11-332941

(51) Int. Cl.⁷ .............................. C23C 16/00; H05H 1/00
(52) U.S. Cl. .......................... 118/725; 118/724; 118/728; 156/345
(58) Field of Search .................................... 118/724, 725, 118/728, 715; 219/390, 411, 391, 496; 392/416, 418; 156/345

(56) References Cited

U.S. PATENT DOCUMENTS

| | | | |
|---|---|---|---|
| 4,533,820 | * 8/1985 | Shimizu | 219/411 |
| 4,924,073 | * 5/1990 | Chiba | 219/411 |
| 6,021,152 | * 2/2000 | Olsen et al. | 118/724 |
| 6,106,628 | * 8/2000 | Takahashi | 118/725 |

FOREIGN PATENT DOCUMENTS 10102257   4/1998 (JP).

OTHER PUBLICATIONS

U.S. application No. 09/280,024, Takahashi et al., filed Mar. 26, 1999.

U.S. application No. 09/280,891, Takahashi et al., filed Mar. 29, 1999.

* cited by examiner

*Primary Examiner*—Gregory Mills
*Assistant Examiner*—P. Hassanzadeh
(74) *Attorney, Agent, or Firm*—Marshall & Melhorn, LLC

(57) ABSTRACT

In a heat treatment system for heating a semiconductor wafers, around a processing chamber is defined an enclosed heating chamber that can be either filled with gases or evacuated. The heater elements consist of halogen infrared lamps received in concentric grooves having a mirror surface. It is therefore possible to achieve a favorable heat insulation which contributes to a high heat efficiency. When the heating chamber is filled with gases or air, it is possible to achieve a controlled rapid cooling of the processing chamber, and this contributes to a short turnaround time of the heat treatment system.

20 Claims, 6 Drawing Sheets

HEAT TREATMENT SYSTEM USING RING-SHAPED RADIATION HEATER ELEMENTS

This application is a continuation-in-part of U.S. patent application Ser. No. 09/280,891, filed Mar. 29, 1999, which issued on Aug. 22, 2000 as U.S. Pat. No. 6,106,628, and is also a continuation-in-part of U.S. patent application Ser. No. 09/280,024, also filed on Mar. 26, 1999.

TECHNICAL FIELD

The present invention relates to a heat treatment system for heating disk-shaped workpieces such as semiconductor wafers, and in particular to a heat treatment system which is suitable for conducting various heat treatments for manufacturing semiconductor devices such as chemical vapor deposition (CVD), impurity diffusion, annealing, and epitaxial growth.

BACKGROUND OF THE INVENTION

Manufacture of semiconductor devices requires various heat treatment steps under controlled environments. Typically, a large number of semiconductor wafers carried by a wafer boat made of heat resistant material such as quartz glass is received in a processing chamber (such as a diffusion chamber and a reaction chamber) defined inside a pressure vessel typically made of heat resistant material such as quartz glass, and process gases are introduced into the processing chamber. A heating arrangement is placed around the processing chamber, and a desired process is conducted in the processing chamber with the semiconductor wafers heated to a desired temperature.

The heating arrangement for such a heat treatment system typically uses a coil-shaped electroresistive heater element, and the heater element is supported by spacers made of alumina or other refractory material. Additionally, insulating material typically consisting of ceramic fibers is filled in the gap defined between the exterior of the heating arrangement and the outer casing surrounding the processing chamber.

However, such a conventional heat treatment system using a electroresistive heater element has a relatively large heat capacity, and it is not possible to rapidly heat or cool the processing chamber. In other words, because of the time lag in heating or cooling the processing chamber, it is difficult to achieve an accurate and responsive temperature control. In particular, because the insulating material prevents rapid cooling, it is not possible to lower the temperature of the processing chamber as rapidly as desired. This is detrimental in reducing the turnaround time of the heat treatment system, and achieving a high quality heat treatment.

Also, according to a conventional heat treatment system using an electroresistive heater element, it is difficult to achieve an even temperature distribution in the processing chamber. This is particularly significant in view of the increasing demand for semiconductor wafers having large diameters. Handing such large semiconductor wafers requires a correspondingly large processing chamber, and an electroresistive heater element is often unable to heat the central part of the processing chamber as much as the peripheral part of the processing chamber.

Furthermore, an electroresistive heater element tends to produce particles during use, and this may seriously contaminate the clean room environment which is required for semiconductor manufacturing processes.

BRIEF SUMMARY OF THE INVENTION

In view of such problems of the prior art, a primary object of the present invention is to provide a heat treatment system which is capable of rapidly heating and cooling the processing chamber.

A second object of the present invention is to provide a heat treatment system which is capable of accurately and responsively controlling the temperature of the processing chamber.

A third object of the present invention is to provide a heat treatment system which has a short turnaround time, and is therefore economical to operate.

A fourth object of the present invention is to provide a heat treatment system which is compact in design and economical to build.

A fifth object of the present invention is to provide a heat treatment system which is relatively free from contamination.

According to the present invention, these and other objects can be accomplished by providing a heat treatment system for heating a disk-shaped workpiece, comprising: an outer casing; an inner shell received in the outer casing and defining an enclosed cylindrical processing chamber therein, the inner shell being made of radiation heat transmitting material and provided with an inlet and an outlet for admitting and removing processing gases into and out of the processing chamber; an enclosed heating chamber defined between the outer casing and the inner shell, the heating chamber being provided with a port for controlling an inner pressure thereof; and a plurality of ring-shaped heater elements disposed concentrically on an inner axial end surface of the outer casing, the heater elements being provided with individual power feed segments.

Because the enclosed heating chamber defined around the processing chamber can be either filled with gases or evacuated, it is possible to achieve a favorable heat insulation which contributes to a high heat efficiency. When the heating chamber is filled with gases or air, it is possible to achieve a controlled rapid cooling of the processing chamber, and this contributes to a short turnaround time of the heat treatment system.

In particular, when the heater elements consists of halogen infrared lamps, the heater elements can be controlled in a highly responsive manner. Because the heater elements can be individually controlled it is possible to control the heat distribution in the processing chamber at will, and can achieve either a uniform temperature distribution or a temperature gradient as desired. Preferably, the heater elements are received in corresponding ring-shaped grooves formed in the inner wall of the outer casing, each groove being provided with a reflective inner surface. Thus, the emitted heat radiation may be directed inward, and the requirement for insulating the outer casing is minimized so that the system can be designed in a both economical and compact manner.

According to a preferred embodiment suitable for treating a large number of semiconductor wafers at the same time, the inner shell comprises a cylindrical container coaxially received inside the outer casing so as to define the processing chamber inside the container and the heating chamber outside the container, and the outer casing comprises a cylindrical part and a pair of end plates, inner surfaces of the cylindrical part and the end plates being provided with ring-shaped grooves for receiving the heater elements.

When the cylindrical part of the outer casing consists of at least two pieces which are joined by a plane passing through an axial center of the outer casing, the heater elements may be attached to the two casing halves in an alternating fashion so that the power feed segments which do not emit heat may be evenly distributed along the circumference of the casing, and a uniform heating result can be achieved. This arrangement also simplifies the assembling of the casing for the heat treatment system.

In such an arrangement using a cylindrical casing, the inner face of at least one of the end plates may directly face the processing chamber. This end plate is typically adapted to be detachable from the remaining part of the outer housing to permit charging and discharging of workpieces into and out of the processing chamber. If a cover plate made of radiation heat transmitting material is placed over the inner surface of the one end plate so as to define the heating chamber in the grooves of the one end plate, the interior of these grooves may define an auxiliary heating chamber which serves a similar purpose as the heating chamber defined in the cylindrical part of the casing. For the ease of evacuating or pressurizing the auxiliary heating chamber, the grooves may be communicated with each other via communication holes formed in walls separating the adjacent grooves.

According to an embodiment which is suitable for treating a single semiconductor wafer at a time, the outer casing consists of a pair of end plates having inner surfaces provided with ring-shaped grooves for receiving the heater elements, and a cover plate made of radiation heat transmitting material is placed over the inner surface of each of the end plates so as to define the processing chamber between the cover plates, and the heating chamber in the grooves which are separated from the processing chamber by the cover plates.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
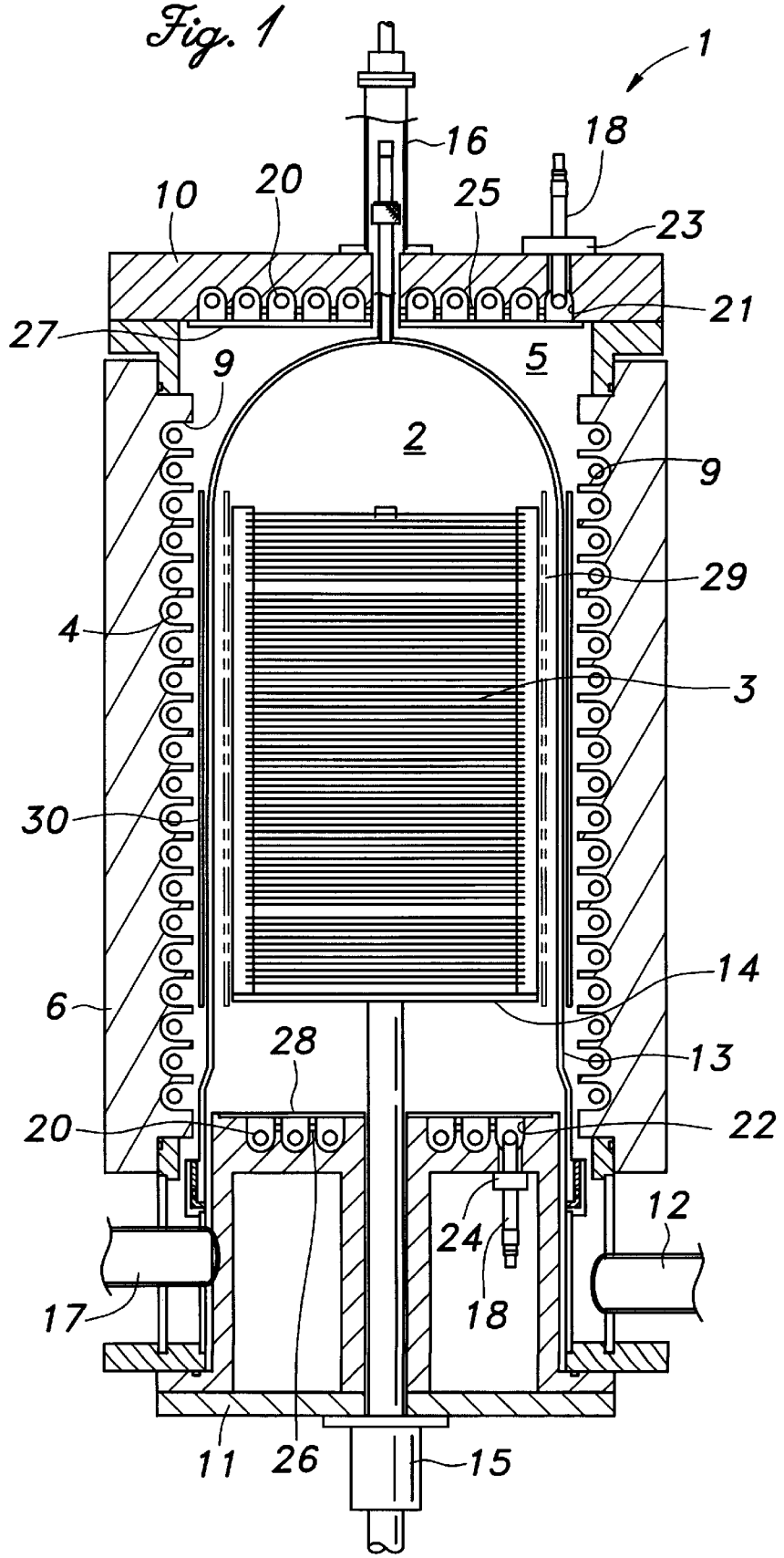
FIG. 1 is a vertical sectional view of a heat treatment system embodying the present invention.

FIG. 1 generally illustrates a heat treatment system 1 embodying the present invention. This heat treatment system 1 comprises a processing chamber 2 defined inside an inner shell 13 made of quartz glass, an annular heating chamber 5 defined coaxially around the processing chamber 2 by a cylindrical casing 6. The processing chamber 2 accommodates therein semiconductor wafers 3 that are going to be processed, and is adapted to receive process gases as described hereinafter. The heating chamber 5 accommodates therein a number of radiation heater elements 4 for heating the semiconductor wafers 3 in the processing chamber 2.

Figure 4:
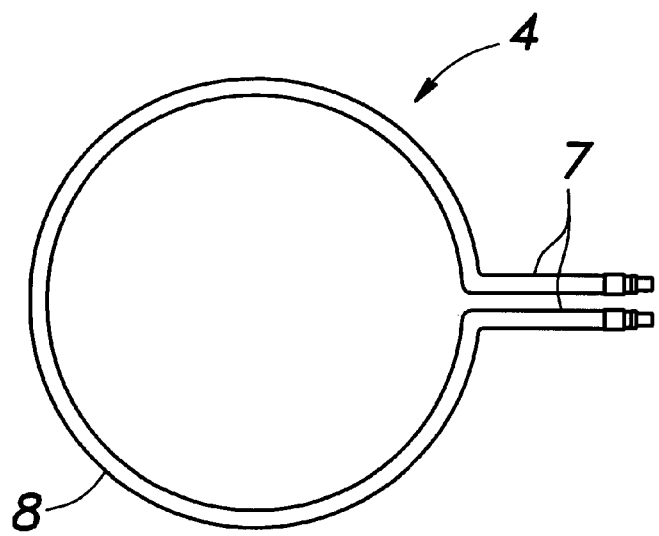
FIG. 4 is a plan view of the heater element for the cylindrical part of the outer casing.
Figure 5:
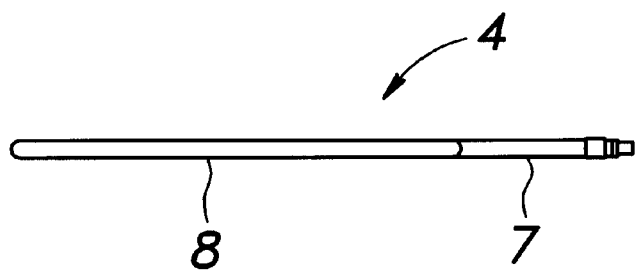
FIG. 5 is a side view of the heater element for the cylindrical part of the outer casing.

In this embodiment, the heater elements 4 each consist of a ring-shaped infrared halogen lamp which includes a ring-shaped infrared radiating element 8 having a pair of electric power feed segments 7 formed in one part thereof, as best shown in FIGS. 4 and 5. These heater elements 4 are arranged coaxially and at a regular interval along the axial length of the cylindrical casing 6. These heater elements can be controlled either individually or collectively as desired. The inner wall of the cylindrical casing 6 is provided with a plurality of annular grooves 9 at a regular interval each receiving an associated one of the heater elements 4, and the inner surface of each annular groove 9 consists of a mirror surface so that the infrared radiation from the heater element 4 is effectively concentrated upon the semiconductor wafers 3.

Figure 2:
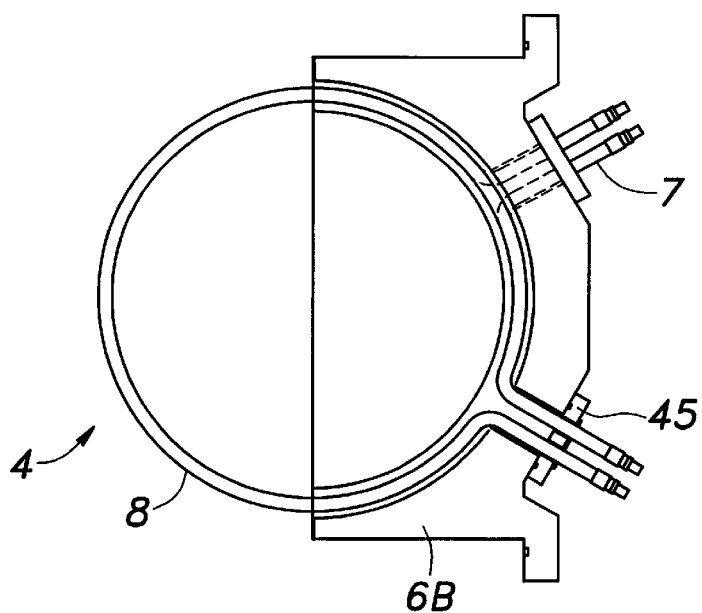
FIG. 2 is a plan view of a casing half of the heat treatment system fitted with heater elements.
Figure 3:
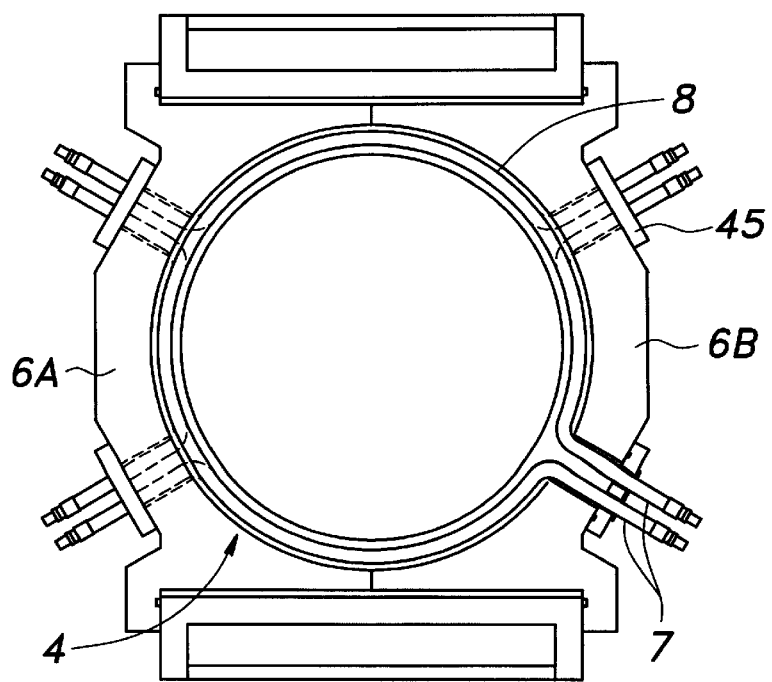
FIG. 3 is a plan view of a cylindrical part of the outer casing of the heat treatment system fitted with heater elements.

The cylindrical casing 6 may be made of a heat resistant metallic material such as aluminum, and defines the heating chamber 5 jointly with an upper end plate 10 and a lower end plate 11 made of similar material and attached to either axial end thereof. The cylindrical casing 6 or the end plates 10 and 11 may not be provided with any massive insulating material, and can be therefore designed both compact and light weight, as opposed to the conventional heat treatment systems using electroresistive heater elements. The main part of the cylindrical casing 6 consists of two semicylindrical casing halves 6A and 6B as illustrated in FIGS. 2 and 3, and the heater elements 4 are attached to the two casing halves 6A and 6B in an alternating manner so that the power feed segments 7 which do not emit infrared radiation may be arranged uniformly along the circumference. In the illustrated embodiment, there are four possible circumferential positions for the power feed segments 7 to be located. Thus, the infrared radiation from the heater elements 4 is distributed evenly in both axial and circumferential directions.

Each of the heater elements 4 is received in the associated groove 9, and the two radially extending power feed segments 7 are passed out of the cylindrical casing 6 via a hole formed in the bottom of the corresponding annular groove 9. The hole for the power feed segments 7 is appropriately sealed so as to keep the heating chamber 5 sealed off from the outside, and to thermally insulate the heater element 4 with respect to the cylindrical casing 6. More specifically, over the outer end of the hole is placed a mounting plate 45 having a pair of holes for individually passing through the power feed segments 7. Each power feed segment 7 is fitted with an O-ring for sealing the annular gap between the power feed segment 7 and the corresponding hole in the mounting plate 45.

The power feed segments 7 are electrically connected to a PID temperature control unit (not shown in the drawings) via connecting pins so that the heater elements 4 may be controlled either individually or collectively. Parts of each heater element adjacent to the power feed segments 7 are appropriately cooled by a known air or water cooling arrangement so that the excessive thermal expansion of various parts of the heater element may not destroy the heater element or damage the seal for the heater element.

The power feed segments 7 are evenly distributed along the circumferential direction so as to avoid any uneven heating results. This arrangement also simplifies the wiring of the heater elements because an excessive concentration of power feed cables can be avoided.

The heating chamber 5 is sealed also in other respects so that its interior may be filled with suitable incombustible gases via a port 12 provided in a lower part of the casing for adjusting its internal pressure. For this purpose, the heating chamber 5 may be controlled by a PID pressure adjusting unit not shown in the drawing. By properly controlling the internal pressure of the heating chamber 5, it is possible to protect the inner shell 13 of the processing chamber 2 from damage, and prevent leakage of process gases from the processing chamber 2. When a thermal insulation is desired, the heating chamber 5 may be evacuated to a desired vacuum level. Normally, the higher the vacuum in the heating chamber 5 is, the better the insulating performance is. When the temperature of the processing chamber 2 is desired to be lowered, the heating chamber 5 may be brought to the atmospheric condition.

The processing chamber 2 is defined by the heat resistant and transparent cylindrical inner shell 13 consisting of a container having a spherical top and an open bottom, and made of quartz glass which permits transmission of near infrared light, and is provided with a suitable mechanical property. The processing chamber 2 accommodates therein a wafer boat 14 carrying a large number of semiconductor wafers 3. The wafer boat 14 is attached to a free end of a rotary shaft 15 of a boat loader (not shown in the drawing) so as to be turned during the course of a heat treatment and moved into and out of the processing chamber 2 as required. For this purpose, the lower end plate 11 is adapted to be detachable from the rest of the casing.

Figure 6:
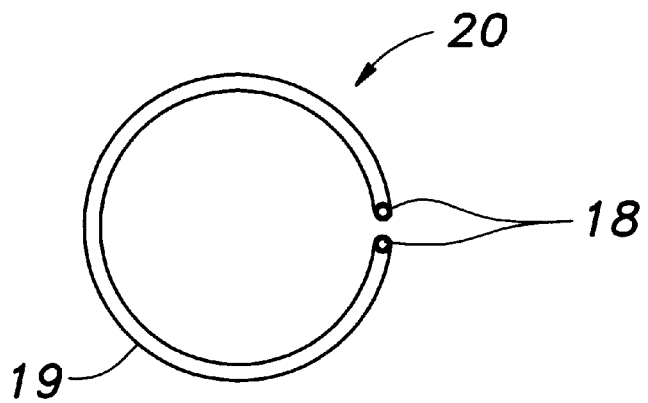
FIG. 6 is a plan view of the heater element for the upper and lower end plates of the outer casing.
Figure 7:
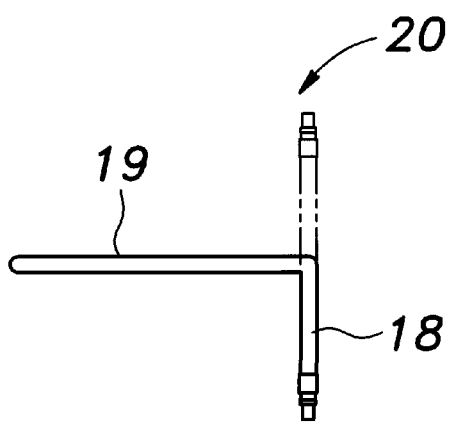
FIG. 7 is a side view of the heater element for the upper and lower end plates of the outer casing.

The inner shell 13 is provided with a process gas inlet 16 at an upper end thereof, and a process gas outlet 17 at a lower end thereof. The upper and lower end plates 10 and 11 are each provided with an auxiliary heater unit. Each auxiliary heater unit comprises a number of heater elements 20 each including a ring-shaped infrared radiating element 19 and a pair of power feed segments 18. In this case, the power feed segments 18 extend axially from a plane defined by the ring-shaped infrared radiating element 19 as best illustrated in FIGS. 6 and 7.

Each heater element 20 is received in one of a number of concentric grooves 21 and 22 provided on the inner faces of the upper and lower end plates 10 and 11. The heater elements 20 are provided with varying diameters which correspond to the diameters of the corresponding annular grooves 21 and 22. The inner surface of each groove consists of a mirror surface. The power feed segments 18 of each infrared heater element are each fitted with an O-ring, and are passed out of the heating chamber via a hole in the end plate 10 or 11 and a mounting plate 24 placed on the outer end of the hole. The power feed segments 18 are appropriately cooled by suitable means.

The grooves 20 formed in the lower end plate 11 are communicated with each other via communication holes 26 provided in the walls separating the adjacent grooves. A cover plate 27 made of heat resistant and light transmitting material such as quartz glass is placed over the inner face of the end plate 11 to seal off the interior of the grooves 22 from the processing chamber 2. Therefore, the interior of the grooves is separated from the processing chamber 2, and may be filled with gases for pressure control or evacuated as desired. The interior of these grooves may be called as an auxiliary heating chamber because it is similar in function to the heating chamber 5 defined outside the inner shell 13. Because the cover plate 28 is supported by the upper ends of the walls separating the adjacent grooves 22 at a regular interval, the cover plate 28 is able to withstand a significant pressure difference between the interior of the grooves and the processing chamber without requiring the thickness of the cover plate to be significant. These infrared heater elements 20 may also be controlled either individually or collectively by using a PID controller or the like which is not shown in the drawing.

Because the inner surface of the upper end plate 10 is directly exposed to the heating chamber 5, the grooves 21 may not be closed by a cover plate, and the heater elements may be simply placed inside the grooves in the same way as the heater elements received in the grooves 9 of the cylindrical casing 6. However, if desired, for instance, to provide an enhanced thermal insulation in the region of the upper end plate, the grooves 21 may be covered by a cover plate 27 in the same way as with the lower end plate 11 as illustrated in FIG. 1.

A heat equalizer tube 29 or 30 may be placed between the infrared heater elements and the workpieces to evenly distribute the radiant heat applied to the workpieces. It may be made of suitable material such as carbon, tantalum or silicon carbide, and may be placed either inside or outside the inner shell 13. The heat equalizer tube 30 receives radiant energy from the infrared heater elements, and radiates the resulting heat evenly upon the workpieces in the processing chamber 2. If the heat equalizer tube is required to be protected from contaminating gases in the processing chamber, it may be placed in the heating chamber as indicated by the imaginary lines 29. If such contamination is not a problem, it may be placed inside the processing chamber for better thermal efficiency as indicated by the solid lines 30.

The operation of this embodiment is described in the following. A number of semiconductor wafers 3 are horizontally supported on the wafer boat 14, and are charged into the processing chamber 2 by using a boat loader. At the same time, the lower end plate 11 is fitted into the lower end of the cylindrical casing 6. The interior of the heating chamber 5 is then evacuated to a vacuum level of about $10^{-3}$ Torr. The interior of the grooves of the upper and lower end plates is likewise evacuated. Thus, the processing chamber is entirely surrounded by a vacuum heat insulation layer.

The interior of the processing chamber 2 is also evacuated by a PID pressure control unit connected to the outlet 17, typically to a level of 50 to $10^{-7}$ Torr. Then, a process gas is introduced into the processing chamber 2 from the inlet 16. When oxide film is desired to be formed on the surface of the wafers, the process gas may consist of $N_2$ and $O_2$, and the inner pressure of the processing chamber 2 is controlled at a desired level which may range from the pressurized condition in the order of 2 $kg/cm^2$ to the evacuated condition in the order of $10^{-7}$ Torr.

Thereafter, power is supplied to the heater elements 4 and 20, and the temperature in the heating chamber 5 and the interior of the grooves (auxiliary heating chambers) is controlled to a desired level (such as 700 to 1,200° C. in the case of forming an oxide layer) by the PID temperature control unit. If desired, a number of thermocouple temperature sensors may be arranged in various places of the heating chamber and the auxiliary heating chambers so that the heater elements may be individually controlled and a desired temperature distribution may be achieved. Therefore, it is possible to achieve a uniform temperature over the entire heating chambers. Alternatively, a desired temperature gradient may be achieved in the entire heating chambers.

When the temperature of the heating chamber is required to be lowered, typically following the completion of a desired heat treatment, the vacuum in the heating chamber and the auxiliary heating chambers may be removed until the interior of these chambers reaches the atmospheric pressure or higher. This causes the temperature of the heating chambers to drop rapidly so that the subsequent heat treatment can be started without any significant time loss. This leads to an improvement in the work efficiency and the reduction in power consumption. Also, the temperature may be finely and quickly adjusted during the course of a single heat treatment. Therefore, undesirable thermal shocks to the semiconductor wafers can be avoided.

The performance of the heat treatment system of the present invention is summarized in the following in comparison with that of a prior art heat treatment system when 50 semiconductor wafers having a diameter of 300 mm were treated.

TABLE 1

|  | Invention | Prior art |
|---|---|---|
| temperature rise (° C./min) | 1,000 | 15–20 |
| temperature equalization (° C.) | ±0.5° C. | ±0.5° C. |
| temperature drop (° C./min) | 300 | 5–15 |
| pressure range (Torr) | $1,520-10^{-7}$ | $760-10^{-3}$ |

Figure 8:
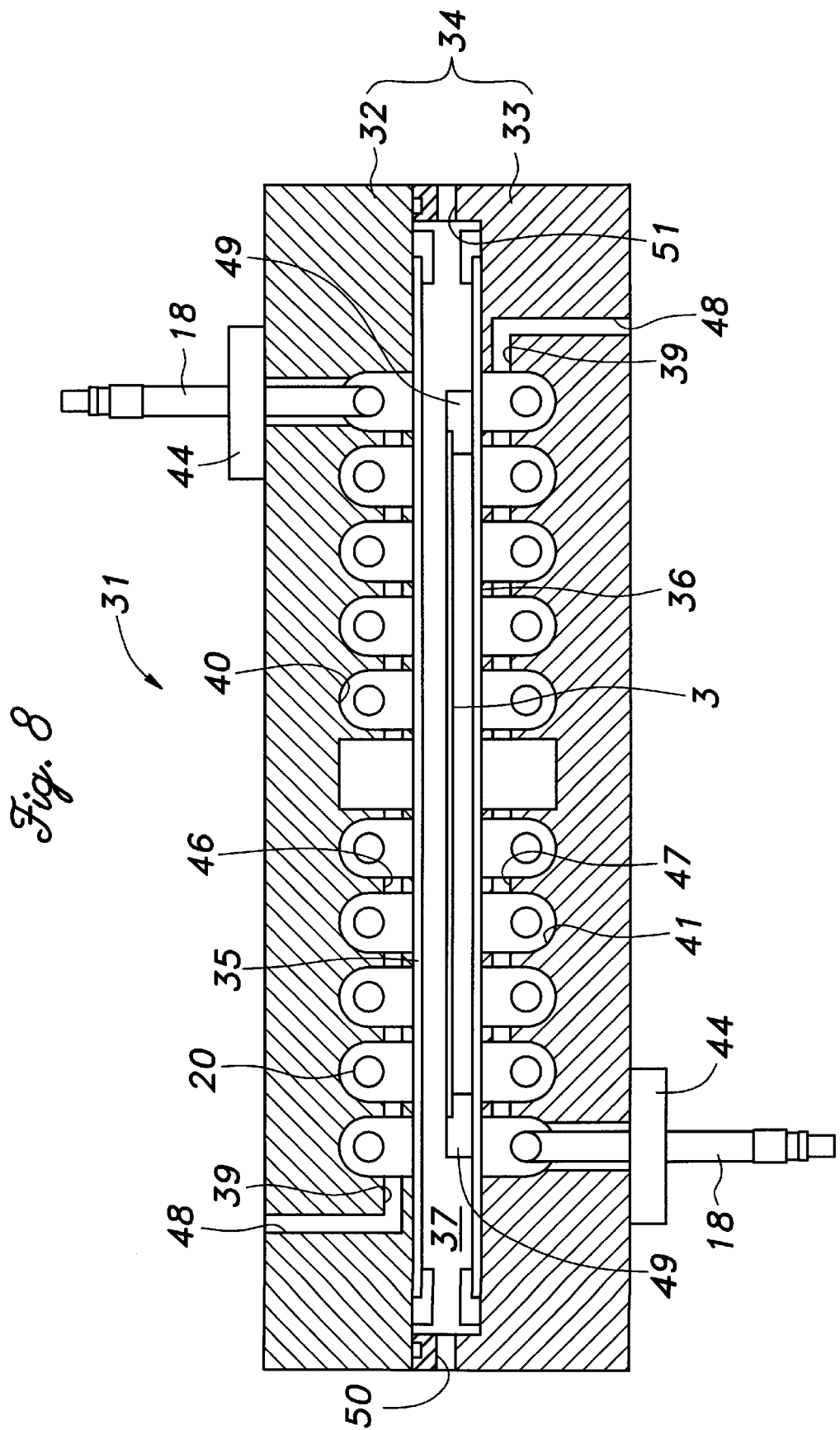
FIG. 8 is a vertical sectional view of a second embodiment of the heat treatment system according to the present invention.
Figure 9:
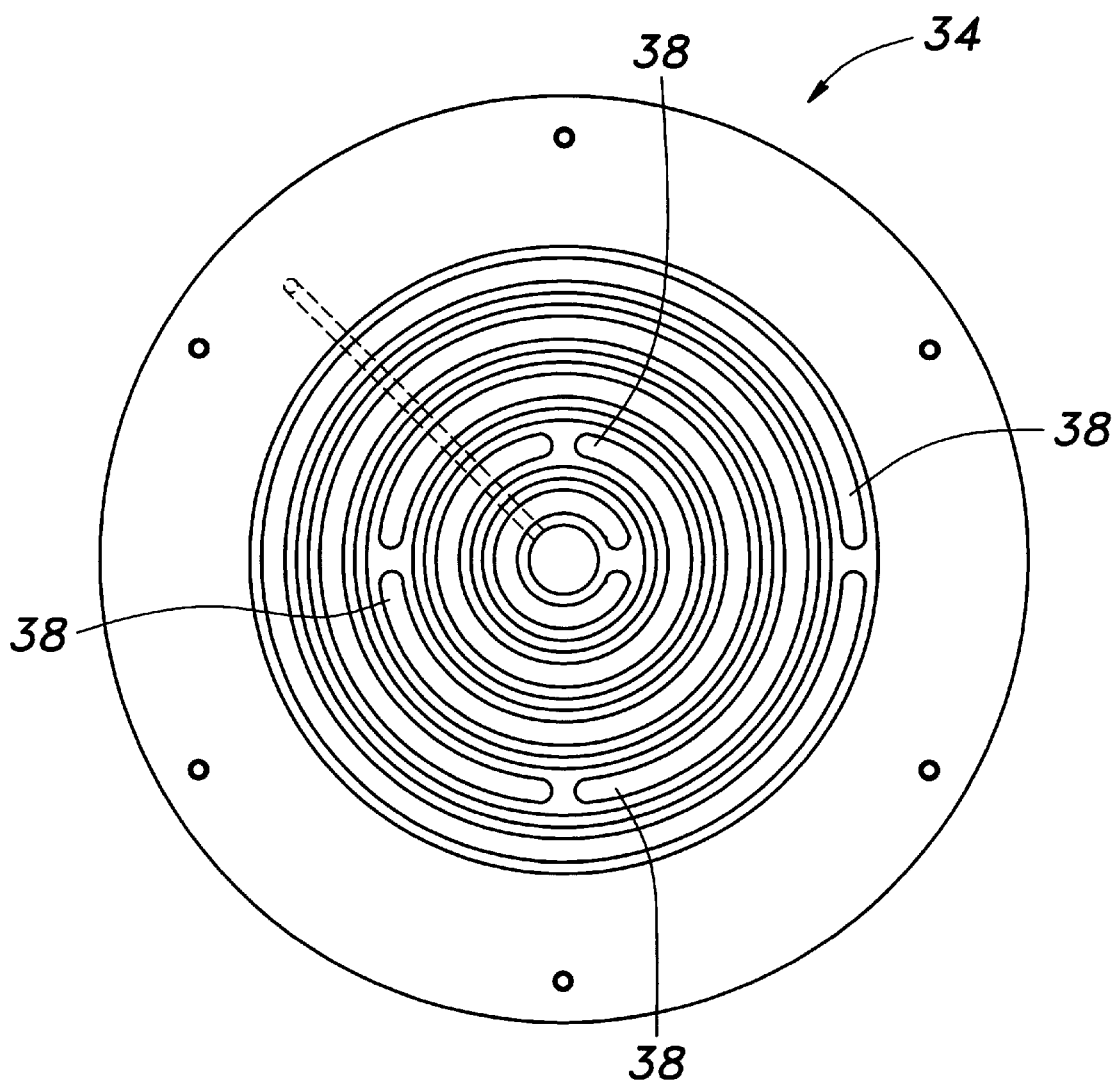
FIG. 9 is a plan view of a lower half of the outer casing of the embodiment illustrated in FIG. 8.

The present invention may also be applied to a sheet-fed system as illustrated in FIGS. 8 and 9. This heat treatment system 31 comprises an outer casing 34 consisting of a disk-shaped upper case half 32 and a similarly shaped lower case half 33. The opposing faces of these case halves are each provided with a number of concentric grooves 40 and 41. A circular quartz glass plate 35 or 36 is placed over each of these opposing faces via an O-ring or the like so that the interior of the grooves 40 and 41 is sealed off from a processing chamber 37 defined between the opposing faces of the upper and lower casing halves 32 and 33. The adjacent grooves 40 and 41 are communicated with each other via communication holes 46 and 47 formed in the walls separating them from each other. The grooves 40 and 41 which are closed by the cover plates 35 and 36 thus define a pair of heating chambers 37.

A ring-shaped infrared heater elements 38 are received in each of the grooves 40 and 41. These heater elements 38 are similar to those used in the upper and lower end plates 10 and 11 of the previous embodiment, and each include a ring-shaped infrared radiating element 18 having a pair of axially extending electric power feed segments formed in one part thereof as illustrated in FIGS. 6 and 7. In this case also, the cover plates 35 and 36 are supported by the upper ends of the walls separating the grooves, and are able to withstand the pressure difference between the processing chamber 37 and the heating chambers.

This system is also provided with an inlet 50 for admitting process gases into the processing chamber 37, and an outlet 51 for removing gases from the processing chamber 37. The heating chambers 39 are provided with ports 48 for adjusting the inner pressure of the heating chambers 39.

The performance of this heat treatment system is summarized in the following when a semiconductor wafer having a diameter of 200 mm was treated.

TABLE 2

| Invention | |
|---|---|
| temperature rise (° C./sec) | 500 |
| temperature equalization (° C.) | ±1 |

TABLE 2-continued

| Invention | |
|---|---|
| temperature drop (sec) | from 1,000 to 300° C.<br>(1) 2.5 sec (when the internal pressure is increased from $10^{-3}$ Torr to 50 Torr)<br>(2) 4 sec (when the internal pressure is maintained at $10^{-3}$ Torr) |

Although the present invention has been described in terms of preferred embodiments thereof, it is obvious to a person skilled in the art that various alterations and modifications are possible without departing from the scope of the present invention which is set forth in the appended claims.

What is claimed is:

1. A heat treatment system for heating a disk-shaped workpiece, comprising:
an outer casing;
an inner shell received in said outer casing and defining an enclosed cylindrical processing chamber therein, said inner shell being made of radiation heat transmitting material and provided with an inlet and an outlet for admitting and removing processing gases into and out of said processing chamber;
an enclosed heating chamber defined between said outer casing and said inner shell, said heating chamber being provided with a port for introducing gas into said heating chamber and a port for evacuating said heating chamber; and
a plurality of ring-shaped heater elements disposed concentrically on an inner axial end surface of said outer casing, said heater elements being provided with individual power feed segments.

2. A heat treatment system according to claim 1, wherein said heater elements are received in corresponding ring-shaped grooves formed in the inner wall of said outer casing, each groove being provided with a reflective inner surface.

3. A heat treatment system according to claim 2, wherein said inner shell comprises a cylindrical container coaxially received inside said outer casing so as to define said processing chamber inside said container and said heating chamber outside said container, and said outer casing comprises a cylindrical part and a pair of end plates, inner surfaces of said cylindrical part and said end plates being provided with said ring-shaped grooves for receiving said heater elements.

4. A heat treatment system according to claim 3, wherein said cylindrical part of said outer casing consists of at least two pieces which are joined by a plane passing through an axial center of said outer casing.

5. A heat treatment system according to claim 3, wherein an inner surface of one of said end plates jointly defines said processing chamber with said cylindrical container, and a cover plate made of radiation heat transmitting material is placed over the inner surface of said one end plate so as to define the heating chamber in the grooves of said one end plate.

6. A heat treatment system according to claim 5, wherein said grooves are communicated with each other via communication holes formed in walls separating the adjacent grooves.

7. A heat treatment system according to claim 5, wherein said one end plate is adapted to be detachable from the remaining part of said outer casing to permit charging and discharging of workpieces into and out of said processing chamber.

8. A heat treatment system according to claim 2, wherein said outer casing consists of a pair of end plates having inner surfaces provided with ring-shaped grooves for receiving said heater elements, and a cover plate made of radiation heat transmitting material is placed over the inner surface of each of said end plates so as to define the processing chamber between said cover plates, and the heating chamber in the grooves which are separated from the processing chamber by said cover plates.

9. A heat treatment system according to claim 1, wherein said heater elements comprises halogen infrared lamps.

10. A heat treatment system according to claim 1, wherein said workpiece consists of a semiconductor wafer.

11. A heat treatment system for heating a disk-shaped workpiece, comprising:

an outer casing;

an inner shell received in said outer casing and defining an enclosed cylindrical processing chamber therein for receiving said workpiece in a concentric arrangement, said inner shell being made of radiation heat transmitting material and provided with an inlet and an outlet for admitting and removing processing gases into and out of said processing chamber;

a heating chamber defined between said outer casing and said inner shell; and a plurality of ring-shaped heater elements disposed concentrically on an inner surface of said outer casing.

12. A heat treatment system according to claim 11, wherein said ring-shaped heater elements have a substantially same diameter, and are arranged on a circumferential surface of said outer casing along an axial line thereof.

13. A heat treatment system according to claim 11, wherein said inner shell comprises a cylindrical container coaxially received inside said outer casing so as to define said processing chamber inside said container and said heating chamber outside said container, and said outer casing comprises a cylindrical part and a pair of end plates.

14. A heat treatment system according to claim 13, wherein said cylindrical part of said outer casing consists of at least two pieces which are joined by a plane passing through an axial center of said outer casing.

15. A heat treatment system according to claim 14, wherein an inner surface of one of said end plates jointly defines said processing chamber with said cylindrical container.

16. A heat treatment system according to claim 15, wherein said one end plate is adapted to be detachable from the remaining part of said outer casing to permit charging and discharging of workpieces into and out of said processing chamber.

17. A heat treatment system according to claim 11, wherein said heater elements have varying diameters, and are arranged concentrically on an inner axial end surface of said outer casing.

18. A heat treatment system according to claim 17, wherein said outer casing consists of a pair of end plates having inner surfaces provided with ring-shaped grooves for receiving said heater elements, and a cover plate made of radiation heat transmitting material is placed over the inner surface of each of said end plates so as to define the processing chamber between said cover plates, and the heating chamber in the grooves which are separated from the processing chamber by said cover plates.

19. A heat treatment system according to claim 11, wherein said heater elements comprises halogen infrared lamps.

20. A heat treatment system according to claim 11, wherein said workpiece consists of a semiconductor wafer.

* * * * *